(12) United States Patent
Ling

(10) Patent No.: US 9,178,526 B2
(45) Date of Patent: Nov. 3, 2015

(54) MULTI-ZONE DATA CONVERTERS

(71) Applicant: MaxLinear, Inc., Carlsbad, CA (US)

(72) Inventor: Curtis Ling, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 14/623,743

(22) Filed: Feb. 17, 2015

(65) Prior Publication Data

US 2015/0162930 A1 Jun. 11, 2015

Related U.S. Application Data

(63) Continuation of application No. 14/246,576, filed on Apr. 7, 2014, now Pat. No. 8,981,982.

(60) Provisional application No. 61/808,855, filed on Apr. 5, 2013.

(51) Int. Cl.
H03M 1/66 (2006.01)
H03M 1/18 (2006.01)
H03M 1/00 (2006.01)
H03M 1/36 (2006.01)
H03M 1/70 (2006.01)
H03M 1/74 (2006.01)

(52) U.S. Cl.
CPC .............. *H03M 1/188* (2013.01); *H03M 1/002* (2013.01); *H03M 1/36* (2013.01); *H03M 1/70* (2013.01); *H03M 1/74* (2013.01)

(58) Field of Classification Search
CPC ......... H03M 1/188; H03M 1/70; H03M 1/36; H03M 1/74; H03M 1/002; H03M 1/00; H03M 1/12; H03M 1/66; H03M 1/68; H03M 2201/1109; H03M 2201/122; H03M 2201/3105; H03M 2201/3115; H03M 2201/52; H03M 2201/524
USPC .................................. 341/144, 155, 145, 156
See application file for complete search history.

(56) References Cited

U.S. PATENT DOCUMENTS

| | | | | |
|---|---|---|---|---|
| 5,010,347 | A * | 4/1991 | Yukawa | 341/143 |
| 6,980,140 | B1 | 12/2005 | Rowland et al. | |
| 7,224,305 | B2 | 5/2007 | Haartsen | |
| 7,332,916 | B2 | 2/2008 | Nagata | |
| 7,605,738 | B2 * | 10/2009 | Kuramochi et al. | 341/155 |
| 7,609,100 | B2 | 10/2009 | Nagata | |
| 8,362,934 | B2 | 1/2013 | Matsuzawa et al. | |
| 8,384,578 | B2 * | 2/2013 | Verbruggen et al. | 341/156 |
| 2012/0194375 | A1 * | 8/2012 | Vigoda et al. | 341/155 |

OTHER PUBLICATIONS

"Analog-to-Digital Converter", Wikipedia, the free encyclopedia, 14 pages, dated Mar. 12, 2014.
"Digital-to-Analog Converter", Wikipedia, the free encyclopedia, 7 pages, dated Mar. 12, 2014.
U.S. Appl. No. 14/248,851, filed Apr. 9, 2014, Raja Pullela and Curtis Ling, 49 pages.
U.S. Appl. No. 14/261,870, filed Apr. 25, 2014, Kaveh Moazzami, Pawan Tiwari and Gaurav Chandra, 32 pages.

* cited by examiner

*Primary Examiner* — Jean B Jeanglaude
(74) *Attorney, Agent, or Firm* — McAndrews, Held & Malloy, Ltd.

(57) ABSTRACT

Aspects of a method and system for data converters having a transfer function with multiple operating zones. In some embodiments, an operating zone of the multiple operating zones is characterized by more stringent performance criteria than the other operating zones. Thus, such data converters may receive an input signal and generate an output signal from the input signal per the transfer function and the more stringent performance criteria in the appropriate operating zone.

20 Claims, 8 Drawing Sheets

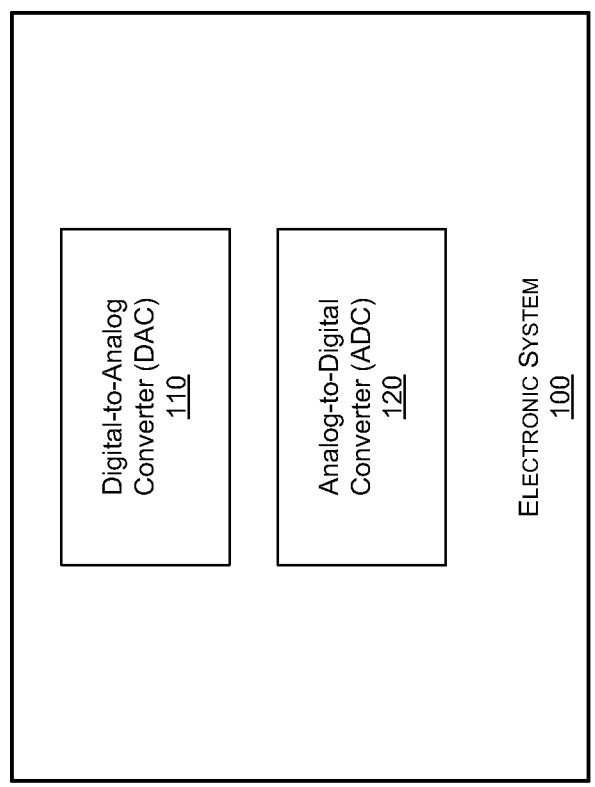

MULTI-ZONE DATA CONVERTERS

CLAIM OF PRIORITY

This patent application is a continuation of U.S. patent application Ser. No. 14/246,576, filed Apr. 7, 2014, which claims priority to and claims benefit from the U.S. Provisional Patent Application Ser. No. 61/808,855, filed on Apr. 5, 2013. The above stated applications are hereby incorporated herein by reference in their entirety.

TECHNICAL FIELD

Certain embodiments of the invention relate to electronic circuits. More specifically, certain embodiments of the invention relate to methods and systems for multi-zone data converters.

BACKGROUND

Existing data converters can be expensive and power hungry. Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for multi-zone data converters, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 1 illustrates an example electronic system that may be operable to perform digital-to-analog and analog-to-digital conversions.

DETAILED DESCRIPTION

Figure 2A:
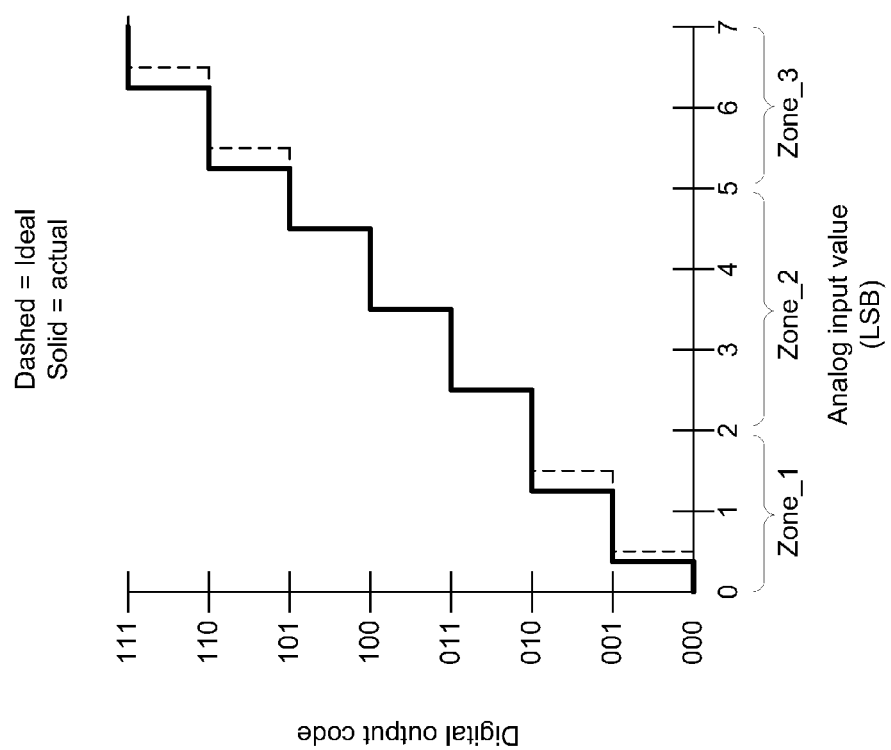
FIGS. 2A and 2B are diagrams illustrating transfer characteristics of example multi-zone analog-to-digital converters.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Aspects of the invention include data converters customized for use in systems, such as communication systems, where much of the dynamic range of the data converters is present only to avoid clipping in the event of infrequent peaks (e.g., resulting from blocker signals). Because the signals whose amplitudes range into the higher digital codes are typically unwanted blocker signals, larger amounts of quantization noise may be tolerable at such signal levels. Accordingly, the transfer function of the data converters may be segmented into multiple zones with different zones having different characteristics (integral nonlinearity, differential nonlinearity, gain offset, and/or the like). For example, various components (e.g., comparators, resistors, capacitors, current sources, amplifiers, and/or the like) may have different design constraints (e.g., size, power consumption, speed, impedance value matching in differential and/or switched capacitor circuits, etc.) based on which bits of digital output code they are responsible for generating.

FIG. 1 illustrates an example electronic system 100 that may be operable to perform analog-to-digital conversion and/or digital-to-analog conversion. The electronic system 100 may comprise suitable circuitry, interfaces, logic and/or code for implementing various aspects of the present disclosure. In this regard, the electronic system 100 may be configured to support performing, executing or running various operations, functions, applications and/or services. For example, the electronic system 100 may be used for executing computer programs, playing video and/or audio content, gaming, communication applications or services (e.g., Internet access/browsing, email, text messaging, chatting and/or voice calling services), and/or networking services (e.g., WiFi hotspot, Bluetooth piconet, and/or active 3G/femtocell data channels).

In some instances, the electronic system 100 may be configured to enable and/or support communication of data. In this regard, the electronic system 100 may communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted or received signals in accordance with applicable wired or wireless protocols.

Examples of wireless protocols or standards that may be supported and/or used by the communication subsystem 250 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+(e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB), direct broadcast satellite (DBS), microwave backhaul, and/or the like. Examples of wired protocols and/or interfaces that may be supported and/or used by the communication subsystem 250 comprise Ethernet (IEEE 802.2), Fiber Distributed Data Interface (FDDI), Integrated Services Digital Network (ISDN), cable (DOCSIS) and Universal Serial Bus (USB) based interfaces. Examples of signal processing operations that may be performed by the electronic system 100 comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to enable or support input/output operations, such as to allow user interactions that may control services provided by the electronic system 100. In this regard, the electronic system 100 may comprise components or subsystems for enabling interactions with a user (e.g., end-user or installer), so as to obtain user input and/or to provide user output.

The electronic system 100 may be a stationary system (i.e. being installed at, and/or configured for use only in particular location). In other instances, however, the electronic system 100 may be a mobile device—i.e., intended for use on the move and/or at different locations. In this regard, the electronic system 100 may be designed and/or configured (e.g., as handheld device) to allow for ease of movement, such as to allow it to be readily moved while being held by the user as the user moves, and the electronic system 100 may be configured to perform at least some of the operations, functions, applications and/or services supported on the move.

Examples of electronic systems may comprise handheld electronic devices (e.g., cellular phones, smartphones, or tablets), personal computers (e.g., laptops or desktops), servers, dedicated multimedia devices (e.g., televisions, game consoles, or portable media players), DBS outdoor units, DBS indoor units (e.g., "set-top boxes"), microwave backhaul outdoor units, microwave backhaul indoor units, or other similar receiver systems, and the like. The disclosure, however, is not limited to any particular type of electronic system.

In operation, the electronic system 100 may be operable to perform various operations, functions, applications and/or services. In this regard, in some instances, performing the various, operations, functions, application or services supported by the electronic system 100 may entail performing various processing operations on data handled by the electronic system 100. For example, communication of data, whether over wired or wireless interfaces, may typically comprise transmitting and/or receiving analog signals that are communicated over wireless and/or wired connections. In this regard, typically analog radio frequency (RF) signals may be used to carry data (e.g., content), which may be embedded into the analog signals using analog or digital modulation schemes. For analog communications, data is transferred using continuously varying analog signals, and for digital communications, the analog signals are used to transfer discrete messages in accordance with a particular digitalization scheme.

Accordingly, handling of digital communications may typically require performing, among other things, digital-to-analog conversion (e.g., via a digital-to-analog converter (DAC) 110) at the transmitting end and analog-to-digital conversion (e.g., via a analog-to-digital converter (ADC) 120) at the receiving end. In this regard, the DAC 110 may comprise circuitry, interfaces, logic and/or code for performing digital-to-analog conversions and may implemented using various types of DACs. For example, the DAC 110 may be implemented using a pulse-width modulator DAC, an oversampling DAC, interpolating DAC, a delta-sigma DAC, binary-weight DAC, and R-2R ladder DAC, a successive-approximation DAC, a cyclic DAC, a thermometer-coded DAC, and/or a hybrid of one or more of the previous DACs. Similarly, the ADC 120 may comprise circuitry, interfaces, logic and/or code for performing analog-to-digital conversions and may be implemented using various types of ADCs. For example, the ADC 120 may be implemented using a direct-conversion ADC, a flash ADC, a successive-approximation ADC, a ramp-compare ADC, a Wilkinson ADC, an integrating ADC, a dual-slope ADC, a multi-slope ADC, a delta-encoded ADC, a counter-ramp ADC, a pipeline ADC, a subranging quantizer ADC, a sigma-delta ADC, a delta-sigma ADC, a time-interleaved ADC, etc.

In some electrical system 100, suitable performance of the electrical system 100 (e.g., measured in terms of signal to noise ratio, symbol error rate, packet error rate, bit error rate, and/or some other metric) may require, or be more dependent upon, the data converter(s) (e.g., DAC 110 and/or ADC 120) maintaining a high level of performance (measured in terms of digital nonlinearity (DNL), integral nonlinearity (INL), gain offset, and/or the like) in one or more ranges or zones of operation, but may not require, or may be less dependent upon, the data converter(s) maintaining a high level of performance in one or more other ranges or zones of operation. In such situations, various performance criteria of the DAC 110 and/or the ADC 120 may be relaxed in operations zones where lower performance has a lesser impact on the performance of the electrical system 100. In this manner, the electrical system 100 may be able to achieve a level of performance typically associated with use of high-end, high-cost data converters when using lower-cost data converters that provide better performance in zones of operation having greater influence on the performance of the electrical system 100, but lesser performance in zones of operating having a lesser influence on the performance of the electrical system 100.

To this end, a transfer function of an example ADC 120 is shown in FIG. 2A. As shown, a first zone Zone_1 may range from analog input value of 0 to V1 (in the example shown V1=2×VLSB, and VLSB is the voltage corresponding to one least significant bit), a second zone Zone_2 may range from an analog input value of V1 to V2 (V2=5*VLSB in the example shown), and a third zone Zone_3 may range from an analog input value of V2 to +VFS (full-scale)(where VFS=7*VLSB in the example shown). For example, the first zone Zone_1 may be characterized by first integral nonlinearity INL_1, the second zone Zone_2 may be characterized by second integral nonlinearity INL_2, and the third zone Zone_3 may be characterized by a third integral nonlinearity INL_3. The second integral nonlinearity INL_2 may be less than the first integral nonlinearity and may also be less than the third integral nonlinearity (i.e., INL_2<INL_1 and INL_2<INL_3).

Figure 2B:
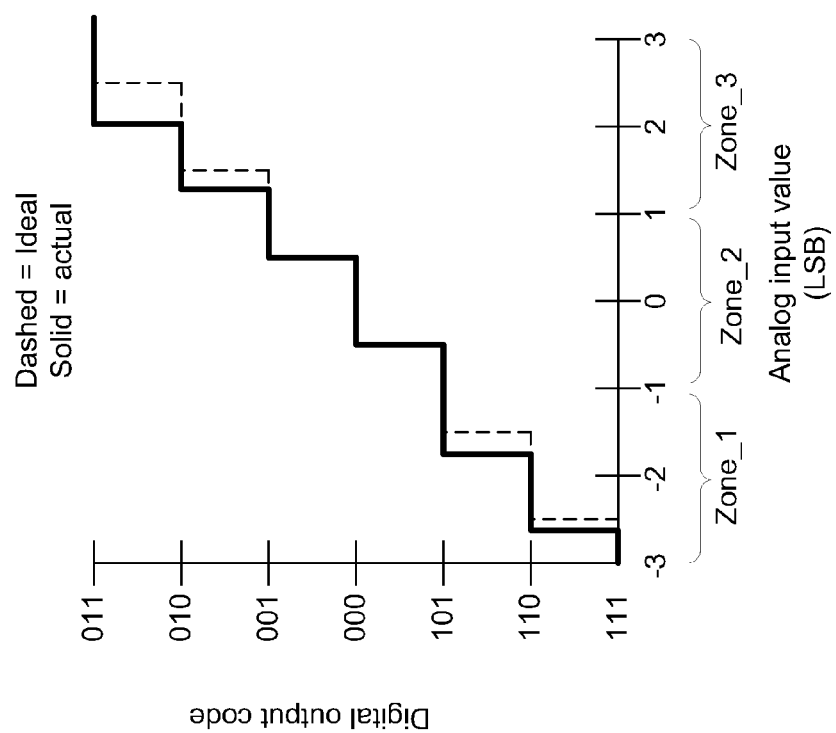

Referring now to FIG. 2B, another transfer function for an example ADC 120 is shown. As shown, the transfer function may include a first zone Zone_1 that ranges from an analog input value of −VFS to −V1, a second zone Zone_2 that ranges from an analog input value of −V1 to +V1, and a third zone Zone_3 that ranges from an analog input value of +V1 to +VFS. Similar, to the transfer function of FIG. 2A, performance criteria (e.g., specified in terms of digital nonlinearity (DNL), integral nonlinearity (INL), gain offset, and/or the like) may be relaxed in the outer zones Zone_1 and Zone_3 and more stringent in the central zone Zone_2.

Thus, as shown in FIGS. 2A and 2B, an example ADC 120 may be implemented such that the second zone Zone_2 achieves better performance (e.g., measured in terms of digital nonlinearity (DNL), integral nonlinearity (INL), gain offset, and/or the like) than the first zone Zone_1 and the third zone Zone_3. If performance of the second zone Zone_2 is more important to the performance of the electrical system 100 than the performance of the first zone Zone_1 and the third zone Zone_3, then the electrical system 100 may be able to achieve an operating performance with such an ADC 120 that typically would require a higher-cost ADC that performs as well in all zones as ADC 120 does in the second zone Zone_2.

Figure 3A:
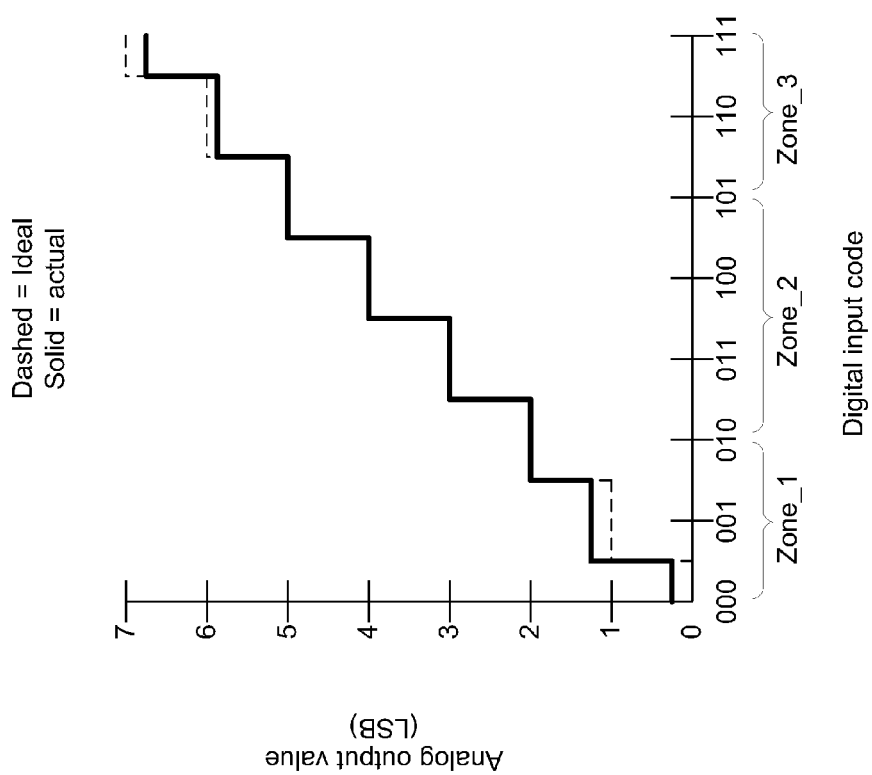
FIGS. 3A and 3B are diagrams illustrating transfer characteristics of example multi-zone analog-to-digital converters.
Figure 3B:
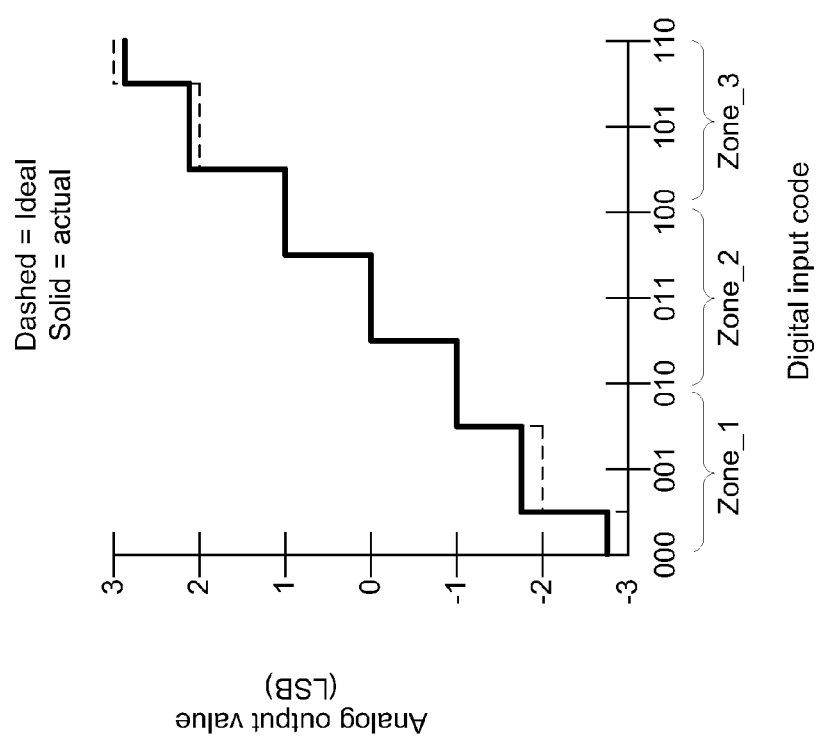

FIGS. 3A and 3B illustrate example DAC transfer functions which exhibit a multi-zone concept similar to the ADC transfer functions of FIGS. 2A and 2B. In particular, a transfer function of an example DAC block 120 is shown in FIG. 3A. As shown, a first zone Zone_1 may range from a digital input code of 000 to 010, a second zone Zone_2 may range from a digital input code 010 to 101, and a third zone Zone_3 may range from a digital input code of 101 to 111. The first zone Zone_1 may be characterized by first digital nonlinearity DNL_1, the second zone Zone_2 may be characterized by second digital nonlinearity DNL_2, and the third zone Zone_3 may be characterized by third digital nonlinearity DNL_3. The second digital nonlinearity DNL_2 may be less than the first digital nonlinearity DNL_1 and may be also less than the third digital nonlinearity (i.e., DNL_2<DNL_1 and DNL_2<DNL_3).

Referring now to FIG. 3B, another transfer function for an example DAC 110 is shown. As shown, the transfer function may include a first zone Zone_1 that ranges from a digital input code of 000 to 010, a second zone Zone_2 that ranges from a digital input code of 010 to 100, and a third zone Zone_3 that ranges from a digital input code of 100 to 110. Similar to the transfer function of FIG. 3A, performance criteria (e.g., specified in terms of digital nonlinearity (DNL), integral nonlinearity (INL), gain offset, and/or the like) may be relaxed in the outer zones Zone_1 and Zone_3 and more stringent in the central zone Zone_2.

Thus, as shown in FIGS. 3A and 3B, an example DAC 110 may be implemented such that the second zone Zone_2 provides better performance (e.g., measured in terms of digital nonlinearity (DNL), integral nonlinearity (INL), gain offset, and/or the like) than the first zone Zone_1 and the third zone Zone_3. If performance of the second zone Zone_2 is more important to the performance of the electrical system 100 than performance of the first zone Zone_1 and the third zone Zone_3, then the electrical system 100 may be able to achieve an operating performance with such an DAC 110 that typically would require a higher-cost DAC that performs as well in all zones as DAC 110 does in the second zone Zone_2.

The boundaries between zones (e.g., how low to set the split between Zone_1 and Zone_2 and/or how high to set the split between Zone_2 and Zone_3 in the previous examples) may be determined based on characteristics of signals to be processed by the data converters 110, 120. Performance criteria (e.g., INL, DNL, gain offset, and/or the like) for each zone of any given DAC or ADC may similarly be determined based on characteristics of signals to be processed by DAC or ADC. For digitizing received communications signals, for example, highest performance (e.g., relatively low INL, relatively low DNL, and relatively low gain offset) may be required of the mid-range digital input/output codes or analog input/output voltage values while lower performance (e.g., relatively high INL, relatively high DNL, and/or relatively high gain offset) may be tolerated for low-range and high-range digital input/output codes or analog input/output voltage values. Thus, cost-savings may be achieved through simpler/smaller/faster/etc. circuitry used for processing the low-range and high-range signals, examples of which are described below with reference to FIGS. 4 and 5.

Figure 4:
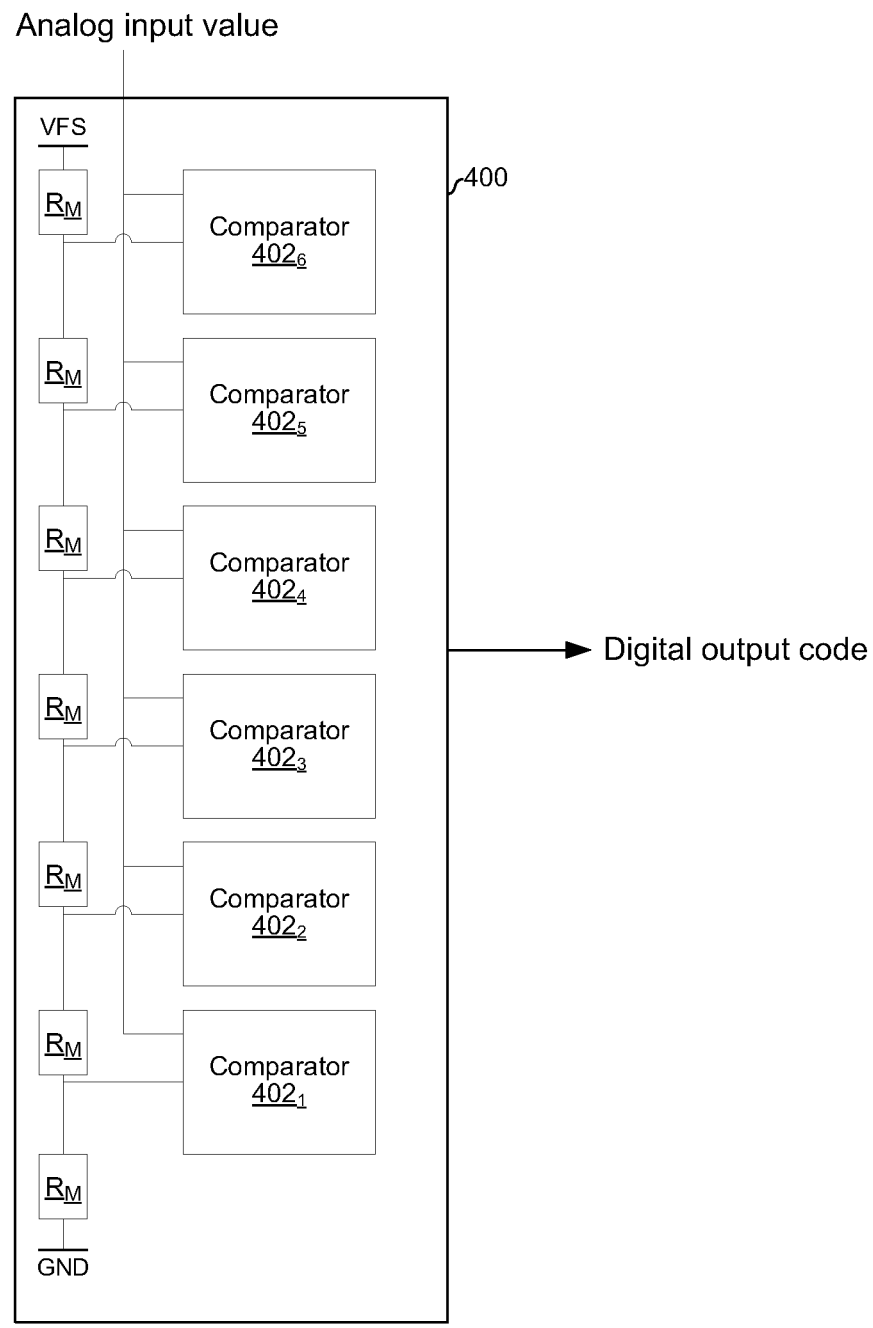
FIG. 4 depicts an example multi-zone flash ADC in accordance with aspects of this disclosure.

FIG. 4 depicts an example multi-zone flash ADC in accordance with aspects of this disclosure. The flash ADC 400 shown in FIG. 4 is an example implementation of ADC 120 described above. In operation, each comparator $402x$ (for $1 \geq X \geq 6$) compares the input analog voltage to a respective reference voltage. The reference voltages increase as X increases. In an example implementation, comparators $402_1$ and $402_2$ correspond to Zone_1, comparators $402_3$ and $402_4$ correspond to Zone_2, and comparators $402_5$ and $402_6$ correspond to Zone_3. Accordingly, performance criteria for the comparators $402_1$, $402_2$, $402_5$, and $402_6$ (e.g., gain, resolution, input offset, propagation delay, slew rate, and/or the like) may be relaxed as compared to the performance criteria for comparators $402_3$ and $402_4$. This may enable the comparators $402_1$, $402_2$, $402_5$, and $402_6$ to be smaller, consume less power, have relaxed layout constraints, and/or the like as compared to the comparators $402_3$ and $402_4$.

Figure 5:
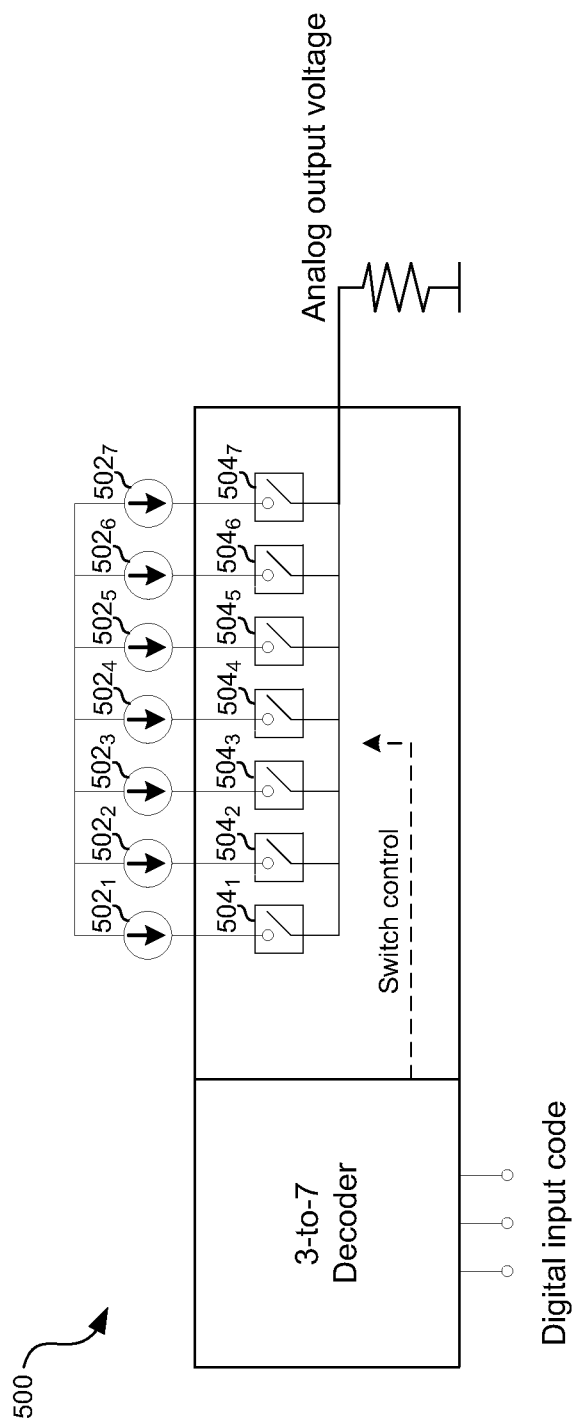
FIG. 5 depicts an example multi-zone DAC in accordance with aspects of this disclosure.

FIG. 5 depicts an example multi-zone DAC in accordance with aspects of this disclosure. The example DAC 500 is an example implementation of the DAC 110 described above. In operation, the value of the digital input value determines which of the switches $504_1$-$504_7$ are closed. For 000 all switches $504_1$-$504_7$ are open, for 001 switch $504_1$ is closed and the rest are open, for 010 switches $504_1$ and $504_2$ are closed and the rest are open, and so forth. In an example implementation current sources $502_1$-$502_4$ and switches $504_1$-$504_4$ correspond to a first zone that requires high performance and current sources $502_5$-$502_7$ and switches $504_5$-$504_7$ correspond to a second zone which can tolerate decreased performance. In such an implementation, the current sources $502_5$-$502_6$ may be lower cost (smaller, lower power consumption, less accurate matching, etc.) than current sources $502_1$-$502_4$ and switches $504_5$-$504_7$ may be lower cost than switches $504_1$-$504_4$ (e.g., switches $504_1$-$504_4$ may be transmission gates and switches $504_5$-$504_7$ may be single transistors).

Figure 6:
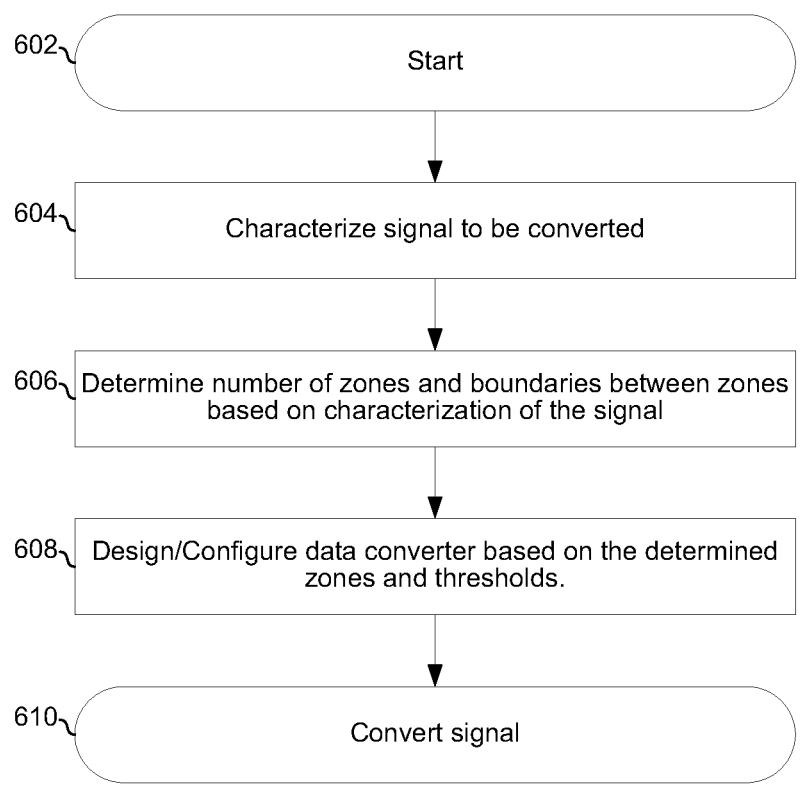
FIG. 6 is a flow chart illustrating an example process for designing/configuring a multi-zone data converter.

FIG. 6 is a flow chart illustrating an example process for designing/configuring a multi-zone data converter. In block 604, after start block 602, a signal to be converted is characterized. This may be done, for example, based on standard/protocols that govern the signal and/or based on characterization of the signal using test equipment. For analog-to-digital conversion, the characterization may comprise, for example, generating a probability vs. analog input value graph or table. For digital-to-analog conversion, the characterization may comprise, for example, generating a probability vs. digital input value graph or table. In block 606, the number of operation zones of the converter, and boundaries between those zones, is determined. For example, using distinct transitions between areas of relatively high probability and areas of low probability may be mapped to boundaries between zones. In block 608, the converter is configured/designed to have the number of zones and boundaries between zones determined in block 606. This may include, for example, implementing relatively high performance components (e.g., comparators, current sources, switches, etc.) for the high-probability zone(s) and relatively low performance components for the low-probability zone(s). In block 610, the converter is used for converting (A to D or D to A) the signal.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method, comprising:
receiving a first input signal with a data converter having a plurality of operating zones;
in response to determining that the first input signal corresponds to a first operating zone of the plurality of operating zones, converting the first input signal to a first output signal per a first circuit of the data converter;
receiving a second input signal with the data converter; and
in response to determining that the second input signal corresponds to a second operating zone of the plurality of operating zones, converting the second input signal to a second output signal per a second circuit of the data converter that has better operating characteristics than those of the first circuit.

2. The method of claim 1, wherein:
said receiving the second input signal comprises receiving a digital input code from the second input signal; and
said converting to the second output signal comprises generating an analog output value for the second output signal that is dependent upon the received digital input code.

3. The method of claim 1, wherein:
said receiving the second input signal comprises receiving an analog input value from the second input signal; and
said converting to the second output signal comprises generating a digital output code for the second output signal that is dependent upon the received analog input value.

4. The method of claim 1, wherein the second operating zone corresponds to a central operating zone of the plurality of operating zones.

5. The method of claim 1, wherein said converting the second input signal to the second output signal comprises generating, with the second circuit, the second output signal with less digital nonlinearity than that with which the first circuit generates the first output signal.

6. The method of claim 1, wherein said converting the second input signal to the second output signal comprises generating, with the second circuit, the second output signal with less integral nonlinearity than that with which the first circuit generates the first output signal.

7. The method of claim 1, wherein said converting the second input signal to the second output signal comprises generating, with the second circuit, the second output signal with less gain offset than that with which the first circuit generates the first output signal.

8. The method of claim 1, wherein said converting the second input signal to the second output signal comprises generating, with the second circuit, the second output signal with less power consumption than that with which the first circuit consumes when generating the first output signal.

9. A data converter providing a plurality of operating zones, the data converter comprising:
one or more circuits, the one or more circuits being operable to convert received input signals to corresponding output signals; wherein the one or more circuits comprise:
a first circuit operable to convert a first input signal into a first output signal if the first input signal corresponds to a first operating zone of the plurality of operating zones; and
second circuit operable to convert the second input signal into a second output signal if the second input signal corresponds to a second operating zone of the plurality of operating zones, wherein the second circuit has better operating characteristics than those of the first circuit.

10. The data converter of claim 9, wherein:
the second input signal comprises a digital input code; and
the second circuit is operable to generate an analog output value for the second output signal that is dependent upon the digital input code.

11. The data converter of claim 9, wherein:
the second input signal comprises an analog input value; and
the second circuit is operable to generate a digital output code for the second output signal that is dependent upon the analog input value.

12. The data converter of claim 9, wherein the second operating zone corresponds to a central operating zone of the plurality of operating zones.

13. The data converter of claim 9, wherein the second circuit is operable to generate the second output signal with less digital nonlinearity than that with which the first circuit is operable to generate the first output signal.

14. The data converter of claim 9, wherein the second circuit is operable to generate the second output signal with less integral nonlinearity than that with which the first circuit is operable to generate the first output signal.

15. The data converter of claim 9, wherein the second circuit is operable to generate the second output signal with less gain offset than that with which the first circuit is operable to generate the first output signal.

16. The data converter of claim 9, wherein the second circuit is operable to generate the second output signal with less power consumption than that with which the first circuit is operable to consume when generating the first output signal.

17. An electronic system, comprising:
an analog-to-digital converter operable to convert analog input signals to corresponding digital output signals; and
a digital-to-analog converter operable to convert digital input signals into corresponding analog output signals, wherein the digital-to-analog converter is operable to convert digital input signals in a first operating zone with less nonlinearity than that of digital input signals in a second operating zone.

18. The electronic system of claim 17, wherein the analog-to-digital converter is operable to convert analog input signals in a third operating zone with less nonlinearity than that of analog input signals in a fourth operating zone.

19. The electronic system of claim 17, wherein:
the first operating zone corresponds to a central operating zone of a plurality of operating zones for the digital-to-analog converter; and
the third operating zone corresponds to a central operating zone of a plurality of operating zones for the analog-to-digital converter.

20. The electronic system of claim 17, wherein the analog-to-digital converter is operable to convert analog input signals in a third operating zone with less gain offset than that of analog input signals in a fourth operating zone.

* * * * *